(12) United States Patent
Kim

(10) Patent No.: US 12,501,795 B2
(45) Date of Patent: Dec. 16, 2025

(54) CIRCUIT BOARD AND DISPLAY DEVICE INCLUDING THE SAME

(71) Applicant: Samsung Display Co., LTD., Yongin-si (KR)

(72) Inventor: Hun Tae Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 473 days.

(21) Appl. No.: 18/116,956

(22) Filed: Mar. 3, 2023

(65) Prior Publication Data

US 2023/0284492 A1    Sep. 7, 2023

(30) Foreign Application Priority Data

Mar. 4, 2022   (KR) ......................... 10-2022-0028324

(51) Int. Cl.
*H10K 59/131* (2023.01)
*H10K 59/80* (2023.01)

(52) U.S. Cl.
CPC ......... *H10K 59/131* (2023.02); *H10K 59/873* (2023.02)

(58) Field of Classification Search
None
See application file for complete search history.

(56) References Cited

U.S. PATENT DOCUMENTS 9,999,133 B2 *   6/2018   Cho ..................... H05K 1/113

FOREIGN PATENT DOCUMENTS

| CN | 113555412 | 10/2021 |
|----|-----------|---------|
| JP | 2005-049686 | 2/2005 |
| KR | 10-2019-0118438 | 10/2019 |
| KR | 10-2020-0091060 | 7/2020 |
| KR | 10-2021-0064474 | 6/2021 |
| KR | 10-2022-0068296 | 5/2022 |

* cited by examiner

*Primary Examiner* — Kyoung Lee
(74) *Attorney, Agent, or Firm* — Lerner David LLP

(57) ABSTRACT

A display device includes a display panel including a display pad and a circuit board including a connection pad including first, second, and third pads, a cover layer, and a base layer, and a connection member between the display panel and the circuit board and electrically connecting the display pad and the connection pad. The first pad is between the connection member and the base layer and is on a first surface of the base layer, the second pad is on a second surface of the base layer, the third pad is spaced apart from the first pad and is on the first surface of the base layer, the cover layer is between the first pad and the third pad and is on the first surface of the base layer, and the first, second, and third pads are electrically connected to each other.

20 Claims, 16 Drawing Sheets

DCPD: 701, 702, 703

DCPD: 701, 702, 703

DCPD: 701, 702, 703

DCPD: 701, 702, 703

DCPD: 701, 702, 703
900: 901, 902

DCPD: 701, 702, 703
900: 901, 902a

DCPD: 701, 702, 703

DCPD: 701, 702, 703
CRD: CRD1, CRD2

DCPD: 701, 702, 703
CRD: CRD1, CRD2
900: 901, 902

CIRCUIT BOARD AND DISPLAY DEVICE INCLUDING THE SAME

CROSS-REFERENCE TO RELATED APPLICATION(S)

This application claims priority to and benefits of Korean Patent Application No. 10-2022-0028324 under 35 U.S.C. § 119, filed on Mar. 4, 2022, in the Korean Intellectual Property Office (KIPO), the entire contents of which are incorporated herein by reference.

BACKGROUND

1. Technical Field

Embodiments relate to a circuit board and a display device including the circuit board.

2. Description of the Related Art

A display device such as a liquid crystal display (LCD) or an organic light emitting device (OLED) includes a display panel for displaying an image, and a driver such as a gate driver or a data driver for driving the display panel. The data driver may be formed as a separate chip, and may be electrically connected to the display panel. The gate driver may be integral with a display panel rather than being formed as a separate chip. Further, the display device may include a touch panel and a touch driver for driving the touch panel.

The display panel or touch panel includes a pad region in which pads for receiving signals from external sources are arranged, and electronic components, such as a flexible printed circuit board, are bonded to the pad region.

SUMMARY

Embodiments provide a display device capable of preventing corrosion and damage of a connection pad of a circuit board due to moisture and/or foreign substances permeating from the outside.

Embodiments also provide a circuit board capable of preventing corrosion and damage of a connection pad of the circuit board due to moisture and/or foreign substances permeating from the outside.

However, embodiments of the disclosure are not limited to those set forth herein. The above and other embodiments of the disclosure will become more apparent to one of ordinary skill in the art to which the disclosure pertains by referencing the detailed description of the disclosure given below.

According to an embodiment of the disclosure, a display device may include a display panel including a display pad, a circuit board disposed at an end portion of the display panel and including a connection pad including: a first pad, a second pad, and a third pad, a cover layer, and a base layer, and a connection member disposed between the display panel and the circuit board and electrically connecting the display pad and the connection pad, wherein the first pad may be disposed between the connection member and the base layer and may be on a first surface of the base layer, the second pad may be disposed on a second surface of the base layer opposite to the first surface of the base layer, the third pad may be spaced apart from the first pad and may be disposed on the first surface of the base layer, the cover layer may be disposed between the first pad and the third pad and may be disposed on the first surface of the base layer, the first pad and the second pad may be electrically connected to each other, and the second pad and the third pad may be electrically connected to each other.

The display device may further comprise a cover member disposed on the circuit board, and the cover member and the connection member may be disposed a same surface of the circuit board.

The cover member may cover a part of the third pad and the cover layer and is spaced apart from a side surface of the display panel adjacent to the cover member.

The connection member may be disposed in a region in which the display panel and the circuit board overlap each other and the cover layer is exposed through a space between the connection member and the cover member.

The connection member may comprise a planar part disposed in a region in which the display panel and the circuit board overlap each other and a protruding part protruding toward the cover member from the planar part.

The protruding part may cover a portion of a side surface of the display panel and is spaced apart from the cover member.

The cover layer may be exposed through a space between the protruding part and the cover member.

The protruding part may cover a portion of a side surface of the display panel and is in direct contact with the cover member.

The cover member may cover a part of the third pad and the cover layer and a side surface of the display panel adjacent to the cover member.

The connection member may be disposed in a region in which the display panel and the circuit board overlap each other.

The connection member may comprise a planar part disposed in a region in which the display panel and the circuit board overlap each other and a protruding part protruding toward the cover member from the planar part.

The protruding part may cover a portion of a side surface of the display panel and is in direct contact with the cover member.

The display device may further comprise an auxiliary cover member disposed at the an end portion of the display panel to cover a portion of a surface of the display panel and a portion of a side surface of the circuit board.

The cover member may overlap the cover layer in a thickness direction and the auxiliary cover member does not overlap the cover layer.

The first pad and the second pad may be connected to each other through a first via hole penetrating the base layer and the second pad and the third pad are connected to each other through a second via hole penetrating the base layer.

An internal space of each of the first via hole and the second via hole may be filled with a conductive material.

The connection member may be in direct contact with the first pad, the base layer may be in direct contact with the cover layer, the first pad, the second pad, and the third pad, and the cover layer may comprise an insulating material.

According to an embodiment of the disclosure, a circuit board may include a connection pad including a first pad, a second pad, and a third pad, a cover layer disposed between the first pad and the third pad and including an insulating material, and a base layer disposed between the first pad and the second pad and between the second pad and the third pad and the second pad, wherein the first pad may be disposed on a first surface of the base layer, the second pad may be disposed on a second surface of the base layer opposite to the first surface of the base layer, the third pad may be spaced apart from the first pad and may be disposed on the first surface of the base layer, the cover layer may be disposed between the first pad and the third pad and may be disposed on the first surface of the base layer, the first pad and the second pad may be electrically connected to each other, and the second pad and the third pad may be electrically connected to each other.

The first pad and the second pad may be connected to each other through a first via hole penetrating the base layer and the second pad and the third pad are connected to each other through a second via hole penetrating the base layer.

The base layer may be in direct contact with the first pad, the second pad, and the third pad, and an internal space of each of the first via hole and the second via hole may be filled with a conductive material.

It should be noted that the effects of the disclosure are not limited to those described above, and other effects of the disclosure will be apparent from the following description.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
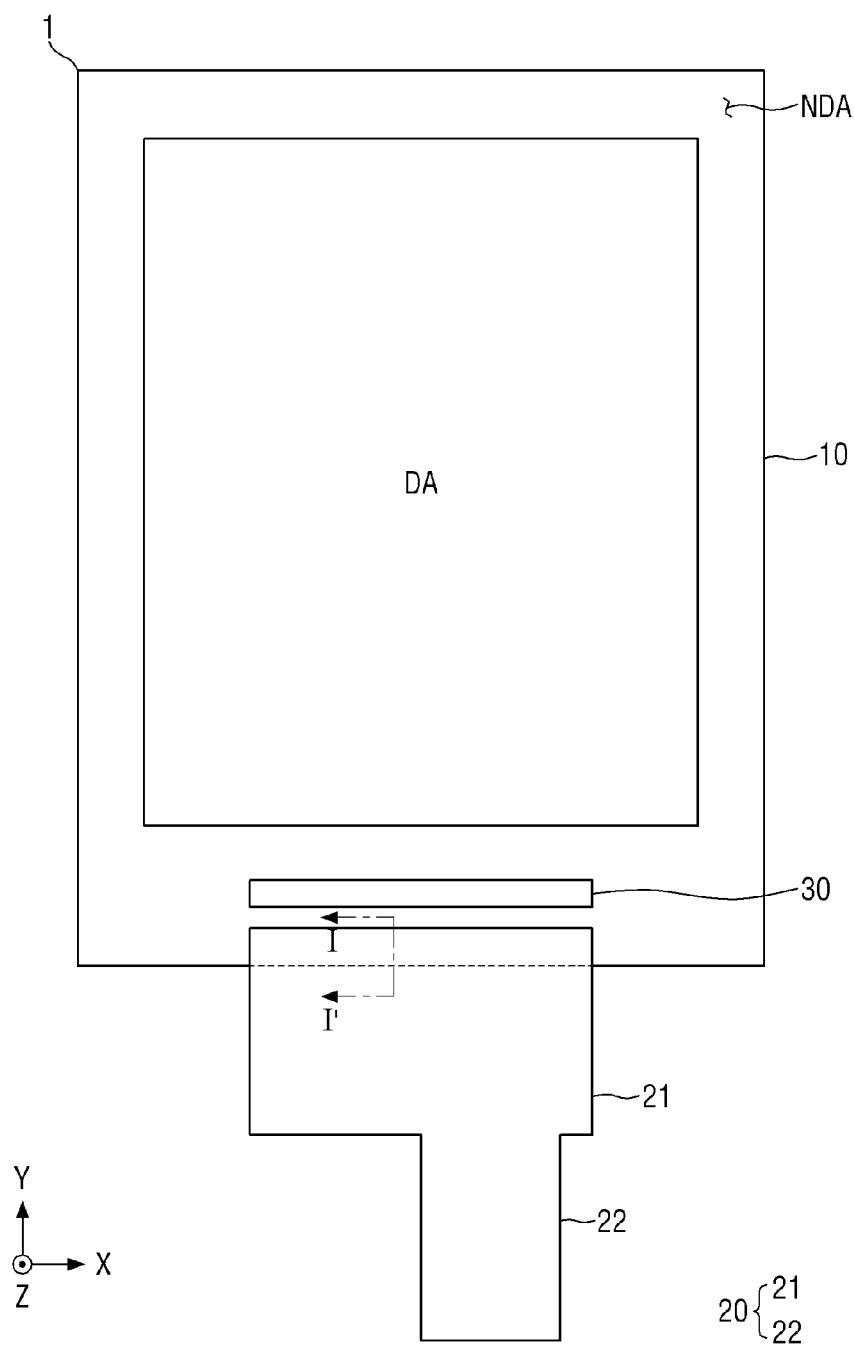
FIG. 1 is a schematic plan view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods disclosed herein. It is apparent, however, that various embodiments may be practiced without these specific details or with one or more equivalent arrangements. Here, various embodiments do not have to be exclusive nor limit the disclosure. For example, specific shapes, configurations, and characteristics of an embodiment may be used or implemented in another embodiment.

Unless otherwise specified, the illustrated embodiments are to be understood as providing features of the invention. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the DR1-axis, the DR2-axis, and the DR3-axis are not limited to three axes of a rectangular coordinate system, such as the X, Y, and Z-axes, and may be interpreted in a broader sense. For example, the DR1-axis, the DR2-axis, and the DR3-axis may be perpendicular to one another, or may represent different directions that are not perpendicular to one another. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of A and B" may be construed as understood to mean A only, B only, or any combination of A and B. Also, "at least one of X, Y, and Z" and "at least one selected from the group consisting of X, Y, and Z" may be construed as X only, Y only, Z only, or any combination of two or more of X, Y, and Z. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Hereinafter, embodiments of the disclosure will be described with reference to the attached drawings.

FIG. 1 is a schematic plan view of a display device according to an embodiment.

In the following description, a first direction X, a second direction Y, and a third direction Z are indicated.

The first direction X may be a direction parallel to a first side of the display device 1 in a plan view, for example, a horizontal direction of the display device 1. The second direction Y may be a direction parallel to a side of the display device 1 that meets the first side of the display device 1 in a plan view, and may be a vertical direction of the display device 1. The third direction Z may be the thickness direction of the display device 1. In the following description, the first direction X indicates the right direction in a plan view, a direction opposite to the first direction X indicates the left direction in a plan view, the second direction Y indicates the upper direction in a plan view, and a direction opposite to the second direction Y indicates the lower direction in a plan view. Further, the third direction Z indicates an upward direction in a cross-sectional view, and a direction opposite to the third direction Z indicates a downward direction in a cross-sectional view. However, it is to be understood that the described directions are intended to mean relative directions, and the disclosure is not limited to the directions described in the embodiments.

The display device 1 may include various electronic devices including a display screen. Examples of the display device 1 may include a mobile phone, a smartphone, a tablet personal computer (PC), a mobile communication terminal, an electronic notebook, a personal digital assistant (PDA), a portable multimedia player (PMP), a navigation device, an ultra-mobile PC (UMPC), a television, a game machine, a wrist watch-type electronic device, a head-mounted display, a personal computer monitor, a notebook computer, a vehicle instrument panel, a digital camera, a camcorder, an external billboard, an electronic billboard, various medical devices, various inspection devices, various household appliances which display an image or a video at a display portion such as a refrigerator or a washing machine, an Internet-of-Things device, and the like. However, embodiments are not limited thereto.

Referring to FIG. 1, at least one of a front surface or a rear surface of the display device 1 may be a display surface. Here, a "front surface" is a surface positioned on a side of a plane and refers to a surface positioned in the third direction Z, and a "rear surface" is a surface positioned on the opposite side of the plane and refers to a surface positioned in a direction opposite to the third direction Z.

In an embodiment, the display surface may be positioned on the front surface of the display device 1, and no image may be seen from or displayed at the rear surface. In the following description, the above-mentioned embodiment will be described. However, the display device 1 may be a double-sided display device in which images may be seen from and displayed at both the front surface and the rear surface.

The display device 1 may include a display panel 10 with a display screen, a display driving circuit (or a display driver chip) 30, a scan driver 50, and a circuit board 20. The display driving circuit 30, the scan driver 50, and the circuit board 20 are disposed in a non-display area NDA of the display panel 10.

Examples of the display panel 10 may include a light-receiving display panel such as a liquid crystal display (LCD) panel and an electrophoretic display (EPD) panel, as well as a self-luminous display panel such as an organic light emitting diode (OLED) panel, an inorganic electroluminescent (EL) display panel, a quantum dot light emitting display (QLED) panel, a micro-LED display panel, a nano-LED display panel, a plasma display panel (PDP), a field emission display (FED) panel, a cathode ray tube (CRT) display panel, and the like. Hereinafter, an organic light emitting display panel will be described as an example of the display panel 10. The organic light emitting display panel applied to the embodiments will be simply referred to as the display panel 10. However, embodiments are not limited to the organic light emitting display panel, and other display panels enumerated above may be applied within the scope of the disclosure.

The display panel 10 may have a rectangular shape having short sides in the first direction X and long sides in the second direction Y in a plan view. The corner where the short side in the first direction X meets the long side in the second direction Y may be formed to have a round shape of a specific curvature or a right angle shape.

The planar shape of the display panel 10 is not limited to a rectangular shape, and may be formed in another polygonal shape, circular shape, or elliptical shape. Further, the display panel 10 may be formed to be flexible such that the display panel 10 may be bendable, foldable, and/or rollable.

The display panel 10 may include a display layer which displays images.

Figure 2:
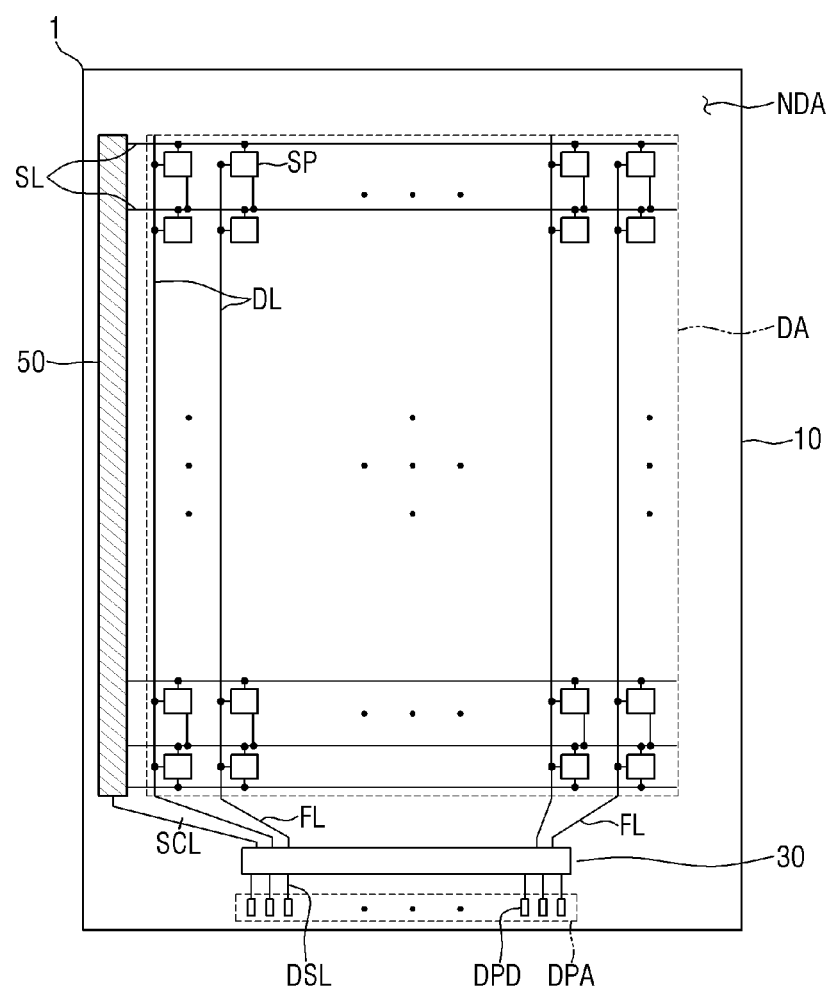
FIG. 2 is a schematic plan view showing an arrangement structure of data signal lines and conductive lines of a circuit board according to an embodiment.
Figure 2:
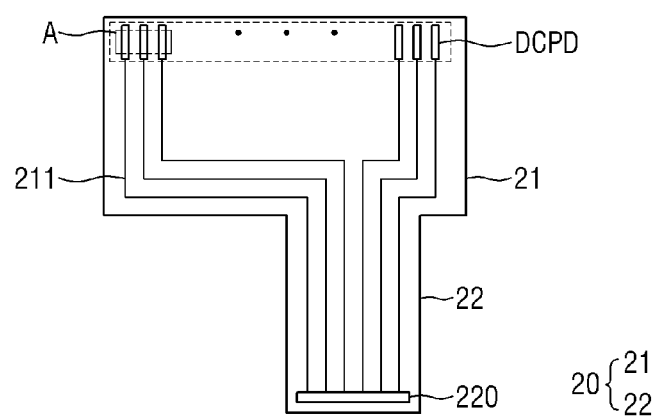

The display layer may include pixels SP (see FIG. 2). A pixel SP may be a basic unit to display an image. The pixel SP may include a red pixel, a green pixel, and a blue pixel. However, embodiments are not limited thereto. The pixels may be alternately arranged when viewed from above (e.g., in a plan view). For example, the pixels SP may be arranged in a matrix form, but embodiments are not limited thereto.

The display layer and a touch layer will be described in detail below.

The display panel 10 may include a display area DA and the non-display area NDA. A portion in which an image may be displayed may be defined as a display area, and a portion in which no image is displayed may be defined as a non-display area.

The shape of the illustrated display area DA may be a rectangle that is longer in the second direction Y than in the first direction X. However, embodiments are not limited thereto, and the display area DA may be shaped like a rectangle that has rounder corners and is longer in the first direction X than in the second direction Y, or may have various shapes, such as another polygonal shape, a circular shapes, or an elliptical shape.

The non-display area NDA may be disposed around the display area DA. The non-display area NDA may be a bezel region. The non-display area NDA may surround all sides of the display area DA. However, embodiments are not limited thereto. For example, the non-display area NDA may be disposed around three sides of the display area DA. For example, the remaining side of the display area DA (i.e., other than the three sides) may form an edge of the display device 1.

In the non-display area NDA, signal lines for applying a signal to the display area DA (e.g., the display area or a touch area) or driving circuits may be arranged. The non-display area NDA may not include the display area and the touch area. The non-display area NDA may be substantially the same as the non-display area where no screen is displayed. In some embodiments, the touch area may partially overlap the non-display area NDA.

The display driving circuit 30 may be disposed in the non-display area at a lower side of the display panel 10. The display driving circuit 30 may be formed as an integrated circuit (IC), and may be attached to the non-display area NDA at the lower side of the display panel 10 by a chip on glass (COG) method, a chip on plastic (COP) method, or an ultrasonic bonding method. For example, the display driving circuit 30 may be attached onto the circuit board 20.

For example, the display driving circuit 30 may receive a clock voltage, a data voltage, and the like from a main processor of a main circuit board through conductive lines (e.g., 211 in FIGS. 2 and 212 in FIG. 3) of the circuit board 20 and generate signals for driving the pixels SP of the display panel 10.

The circuit board 20 may be disposed in the non-display area NDA at the lower side of the display panel 10. The circuit board 20 may be attached onto a display pad part (DPA in FIG. 2) disposed in the non-display area NDA at the lower side of the display panel 10 through a connection member which is described below. The circuit board 20 may include conductive lines 211 for transmitting a signal from the main circuit board to the display driving circuit 30. In the following description, the circuit board 20 has been illustrated as a flexible circuit board including a flexible material. However, embodiments are not limited thereto, and the circuit board 20 may be a rigid circuit board.

FIG. 2 is a schematic plan view showing an arrangement structure of data signal lines and conductive lines of a circuit board 20 according to an embodiment.

For convenience of illustration, FIG. 2 schematically illustrates pixels SP, scan lines SW, data signal lines DL, and the like of the display layer. FIG. 2 illustrates conductive lines 211 connected (e.g., electrically connected) to the display driving circuit 30 through a display pad part DPA among conductive lines of the circuit board 20.

The display panel 10 may include the display layer as described above.

Referring to FIG. 2, the display layer may include pixels SP, and scan lines SL and data signal lines DL which are connected to each of the pixels SP.

Each of the pixels SP may include a light emitting element for displaying an image and thin film transistors configured to drive the light emitting element. The thin film transistors may include a driving transistor configured to control a current flowing through the light emitting element and a switch transistor operating as a switching element. Each of the pixels SP may be connected to at least one of the scan lines SL and a corresponding one of the data signal lines DL.

The scan lines SL may extend in the first direction X from the scan driver 50 disposed in the non-display area NDA at a side of the display panel 10. The scan driver 50 may receive a scan control signal from the display driving circuit 30 through the scan control line SCL, generate a scan signal in response to the scan control signal, and apply the scan signal to the scan lines SL. The scan lines SL may transmit the scan signal applied from the scan driver 50 to each of the pixels SP. The scan driver 50 may control turn-on operation or turn-off operation of the switch transistor through the scan lines SL.

The data signal lines DL may extend in the second direction Y. The data signal lines DL may be connected to the display driving circuit 30 through a fan-out line FL. The data signal lines DL may respectively receive data signals generated by the display driving circuit 30. The display driving circuit 30 may control the amount (or luminance) of light emitted from the light emitting element through the data signal lines DL. For example, the data signals of the data signal lines DL may be applied to a gate electrode of the driving transistor to control the amount of a current flowing through the light emitting element.

Referring to FIG. 2, a display pad part DPA may be disposed in the non-display area NDA at the lower side of the display panel 10. The display pad part DPA may be connected (e.g., electrically connected) to the circuit board 20 through a connection member.

The display pad part DPA may include display pads DPD connected to the display driving circuit 30 through display signal lines DSL. The display signal lines DSL may include data voltage lines for the display driving circuit 30 to generate data signals, a ground connection line, a clock voltage line for generating a scan control signal, and the like.

The circuit board 20 may include a body part 21 and a tail part 22.

The tail part 22 of the circuit board 20 may be connected to the main circuit board. However, embodiments are not limited thereto. For example, the circuit board 20 may include the body part 21 and may be connected to the main circuit board through a separate cable.

The body part 21 may have a rectangular shape that is wider in the first direction X than in the second direction Y when viewed from above (e.g., in a plan view). The width of the body part 21 in the first direction X may be smaller than the width of the display panel 10 in the first direction X. The tail part 22 may have a shape protruding from a lower end portion of the body part 21. The tail part 22 may have a rectangular shape that is wider in the second direction Y than in the first direction X. The width of the tail part 22 in the first direction X may be smaller than the width of the body part 21 in the first direction X. However, embodiments are not limited thereto. For example, the shape of the circuit board 20 may be variously modified such as each of the body part 21 and the tail part 22 of the circuit board 20 having a side which is inwardly recessed or protrudes or at least a portion of the circuit board 20 including a hole.

The circuit board 20 may include connection pads DCPD and conductive lines 211 for the electrical connection with each of the display pads DPD of the display panel 10. The connection pads DCPD may be connected to the display pads DPD of the display panel 10.

The circuit board 20 may include a coupling member 220 disposed at a lower end portion of the tail part 22. The coupling member 220 may be a connector for connection with the main circuit board. However, embodiments are not limited thereto.

As shown in FIG. 2, some conductive lines 211 may extend in a direction opposite to the second direction Y and may be bent and extend in the first direction X in the body part 21, and then may be bent again and extend back in the direction opposite to the second direction Y and be disposed in the tail part 22. Accordingly, the conductive lines 211 may be connected (e.g., electrically connected) to the main circuit board through the coupling member 220.

However, the extending direction of the conductive lines 211 shown in FIG. 2 is schematically illustrated for convenience of description, and the embodiments are not limited thereto. The extending direction of the conductive lines 211 may vary.

Figure 3:
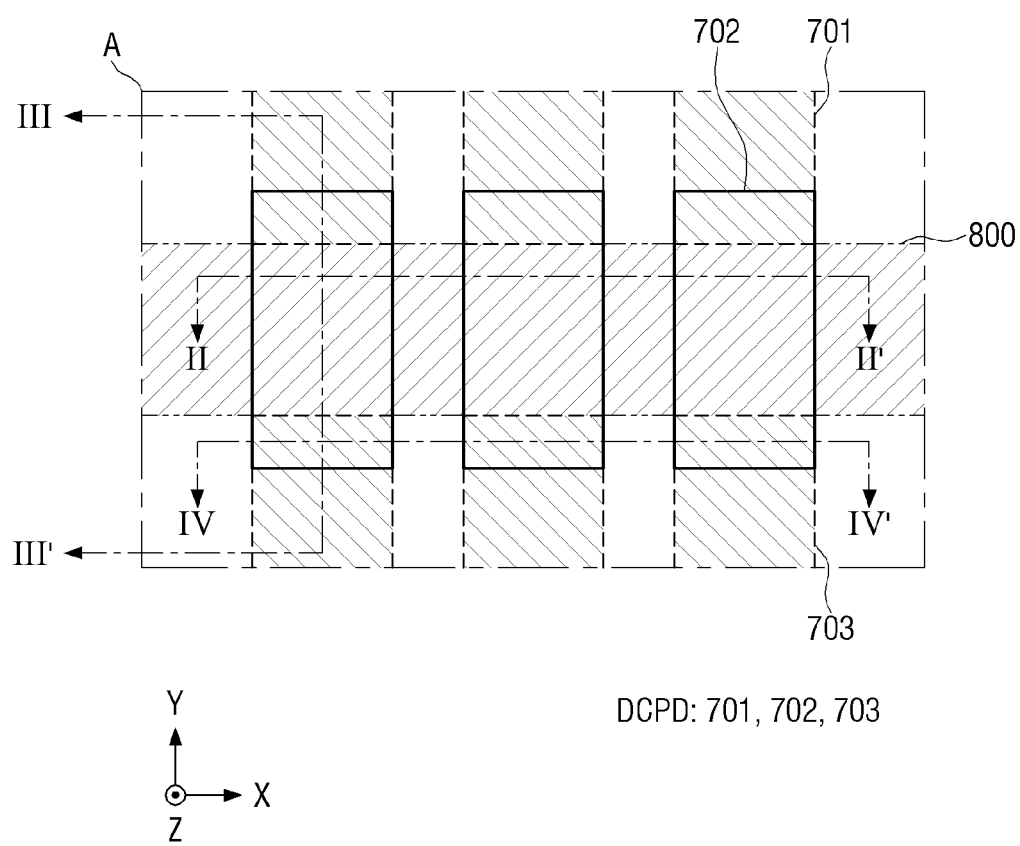
FIG. 3 is a schematic enlarged view of portion A of FIG. 2.

FIG. 3 is a schematic enlarged view of portion A of FIG. 2.

FIG. 3 illustrates the connection pads and a cover layer of the circuit board 20.

Referring to FIG. 3, the connection pads DCPD may include first pads 701, second pads 702, and third pads 703. The first pads 701, the second pads 702, and the third pads 703 may be configured as separate first pads 701, second pads 702, and third pads 703, respectively. The first pad 701 may be disposed at a side in the second direction Y. For example, at least a portion of the second pad 702 may overlap the first pad 701 in the third direction Z and may be disposed to be farther from the upper side of the body part 21 in the direction opposite to the second direction Y than the first pad 701 (e.g., in a plan view). At least a portion of the third pad 703 may overlap the second pad 702 in the direction opposite to the third direction Z and may be disposed to be farther from the upper side of the body part 21 in the direction opposite to the second direction Y than the second pad 702 (e.g., in a plan view). For example, the first pad 701 and the third pad 703 may be disposed on the same layer and spaced apart from each other in the second direction Y, and the second pad 702 may at least partially overlap each of the first pad 701 and the third pad 703 in the third direction Z and may be disposed on a different layer from the layer on which the first pad 701 and the third pad 703 are disposed.

A cover layer 800, the first pads 701, and the third pads 703 may be disposed on the same layer. For example, the cover layer 800 may cover the entire space (or the partial space) between the first pads 701 and the third pads 703, and may extend in the first direction X. Accordingly, the cover layer 800 may at least partially overlap the second pads 702 in the third direction Z.

The first pads 701, the second pads 702, and the third pads 703 function to connect (e.g., electrically connect) the conductive lines 211 of the circuit board 20 to the display pads DPD of the display panel 10.

The first pads 701, the second pads 702, and the third pads 703 may include a conductive material. For example, the first pads 701, the second pads 702, and the third pads 703 may include a material, such as copper, silver, gold, aluminum, or the like.

The cover layer 800 may function to prevent problems, such as corrosion of the connection pads DCPD due to external moisture and/or foreign substances contacting or infiltrating the connection pads DCPD.

The cover layer 800 may include various materials having insulating properties. For example, the cover layer 800 may include at least one of polyimide, polyethylene terephthalate, polyethylene naphthalate, polyethylene sulfide, polyethylene, urethane, polycarbonate, or the like. For example, the cover layer 800 may be made of polyimide.

Figure 4:
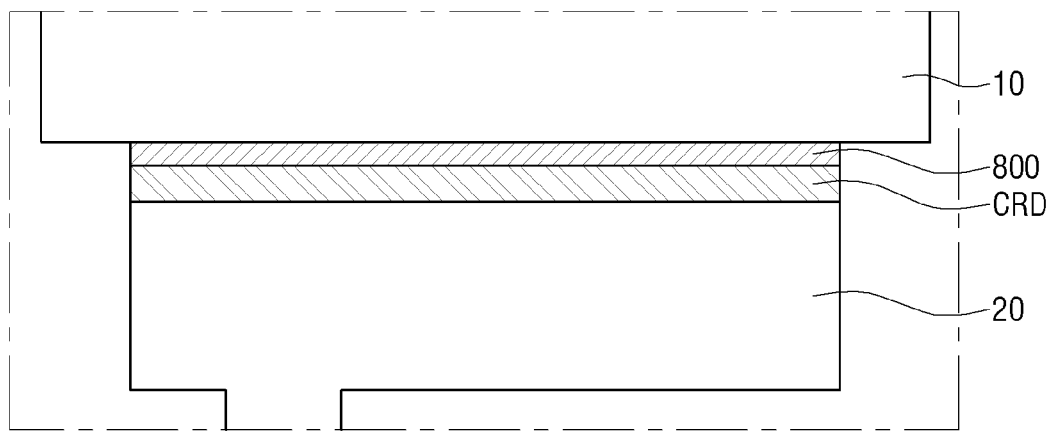
FIG. 4 is a schematic plan view showing a rear surface of a display device.
Figure 4:
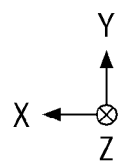

FIG. 4 is a schematic plan view showing a rear surface of a display device.

Referring to FIG. 4, the circuit board 20 may be disposed at a side of the display panel 10 in the direction opposite to the second direction Y in a plan view. A cover member CRD may be disposed on the other surface of the circuit board 20. The cover member CRD on the other surface of the circuit board 20 may be spaced apart from a region adjacent to the other side surface of the display panel 10 in the second direction Y. Accordingly, the cover layer 800 may be exposed by the space between the other side surface of the display panel 10 in the second direction Y and the cover member CRD. The cover layer 800 may block external moisture and/or foreign substances from entering into the display device through the space between the side surface of the display panel 10 and the cover member CRD, thereby preventing problems, such as corrosion of the connection pads DCPD due to the moisture and/or foreign substances permeating from the outside.

The cover member CRD may cover the connection pads DCPD of the circuit board 20 to prevent direct contact of the external foreign substances with the connection pads DCPD. The cover member CRD may include an organic resin. For example, the cover member CRD may be made of an optically clear organic resin, and the optically clear organic resin may be an ultraviolet curable adhesive material, but embodiments are not limited thereto.

Figure 5:
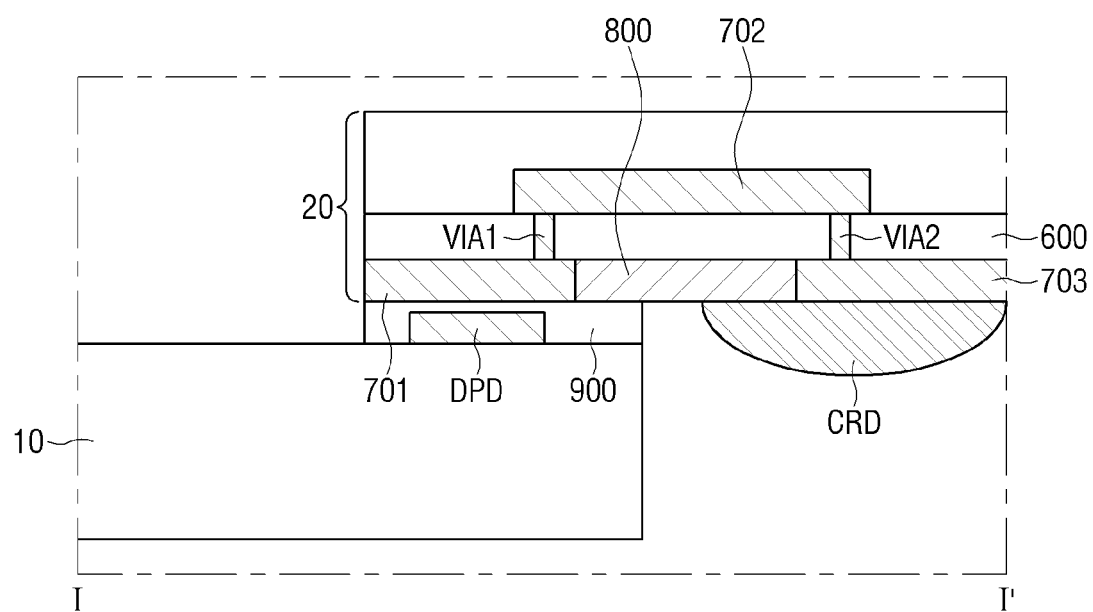
FIG. 5 is a schematic cross-sectional view taken along line I-I' of FIG. 1.

FIG. 5 is a schematic cross-sectional view taken along line I-I' of FIG. 1.

Referring to FIG. 5, the display panel 10 may include a display pad DPD. A connection member 900 may cover an upper surface and side surfaces of the display pad DPD and may be disposed on the display panel 10 in the third direction Z. The circuit board 20 may be disposed on an upper surface of the connection member 900.

The circuit board 20 may include the first pad 701, the second pad 702, the third pad 703, the cover layer 800, a base layer 600, and via holes VIA. The first pad 701, the cover layer 800, and the third pad 703 may be disposed on the same layer (e.g., the base layer 600). The first pad 701 and the third pad 703 may be spaced apart from each other and the cover layer 800 may be disposed between a space between the first pad 701 and the third pad 703. The first pad 701 may at least partially overlap the display pad DPD in the third direction Z. The connection member 900 may be disposed between the first pad 701 and the display pad DPD and be in contact with (e.g., in direct contact with) the first pad 701 and the cover layer 800. For example, the connection member 900 may function to connect (e.g., electrically connect) the display pad DPD to the circuit board 20 and the display panel 10 with attaching the circuit board 20 to the display panel 10. The connection member 900 may include a conductive adhesive member, such as an anisotropic conductive film.

The base layer 600 may be disposed on the front surfaces (or the upper surfaces) of the first pad 701, the cover layer 800, and the third pad 703. For example, the first pad 701 may be disposed between the connection member 900 and the base layer 600 and may be disposed (e.g., directly disposed) on the rear surface (or the lower surface) of the base layer 600. The second pad 702 may be disposed (e.g., directly disposed) on the front surface (or the upper surface) of the base layer 600 opposite to the rear surface of the base layer 600. The third pad 703 may be spaced apart from the first pad 701 in the second direction Y (or in the horizontal direction) and may be disposed (e.g., directly disposed) on the rear surface of base layer 600. For example, the cover layer 800 may be disposed between the first pad 701 and the third pad 703 in the second direction Y (or in the horizontal direction) and may be disposed (e.g., directly disposed) on the rear surface of the base layer 600.

The base layer 600 may include an insulating material to have insulating properties, and function to separate adjacent conductive materials from each other. The base layer 600 may include via holes VIA. The via holes VIA may penetrate the base layer 600 in the third direction Z and include a conductive material in an internal space of the via holes VIA. Hereinafter, a via hole VIA will collectively refer to the space penetrating the base layer 600 and the conductive material filling the internal space of the via hole VIA. Although the conductive material filling inside the via hole VIA has been described as being distinguished from the second pad 702, embodiments are not limited thereto. For example, the conductive material inside the via hole VIA may be integral with the second pad 702 during the process of forming the second pad 702.

Accordingly, the via holes VIA may function to connect (e.g., electrically connect) between the second pad 702 disposed on the front surface (or the upper surface) of the base layer 600 and the first pad 701 disposed on the rear surface (or the lower surface) of the base layer 600 and between the second pad 702 disposed on the front surface of the base layer 600 and the third pad 703 disposed on the rear surface of the base layer 600. The via hole VIA overlapping the first pad 701 and the second pad 702 in the third direction Z is defined as a first via hole VIA1, and the via hole VIA overlapping the third pad 703 and the second pad 702 in the third direction Z is defined as a second via hole VIA2. For example, the first via hole VIA1 may function to connect the first pad 701 and the second pad 702, and the second via hole VIA2 may function to connect the third pad 703 and the second pad 702. The first via hole VIA1 and the second via hole VIA2 may include a conductive material.

The second pads 702 may be disposed on the front surface of the base layer 600. The second pad 702 may at least partially overlap the first pad 701, the cover layer 800, and the third pad 703 in the third direction Z. With the above-described structure, a current flowing through the display pad DPD may sequentially flow to the connection member 900, the first pad 701, the via holes VIA, the second pad 702, and the third pad 703.

Although it has been described that all of the first pad 701, the second pad 702, and the third pad 703 are the connection pads DCPD, embodiments are not limited thereto. For example, in some embodiments, the first pad 701 may be the connection pad DCPD, the third pad 703 may be a circuit pattern for transmitting a signal to the other end portion of the circuit board 20, and the second pad 702 may be a bypass wire connecting the connection pad DCPD and the circuit pattern. In the following description, it is assumed that the first pad 701, the second pad 702, and the third pad 703 are all connection pads DCPD and the third pad 703 is connected to a circuit pattern at a side in the direction opposite to the second direction Y.

The cover member CRD may be disposed on the rear surface of the circuit board 20. For example, the cover member CRD may cover a portion of the rear surfaces of the third pad 703 and the cover layer 800 and may be disposed on the circuit board 20 and spaced apart from the connection member 900 in the direction opposite to the second direction Y. Accordingly, a space between the connection member 900 and the cover member CRD may be formed and the cover layer 800 may be exposed to the outside through the space between the connection member 900 and the cover member CRD.

The cover layer 800 may be disposed on a region which is exposed to the outside through the space between the connection member 900 and the cover member CRD, thereby preventing corrosion of the connection pads DCPD and the conductive lines 211 due to moisture infiltration into the connection pads DCPD exposed to the outside through the space between the connection member 900 and the cover member CRD. For example, the cover layer 800 may cover the region where the circuit board 20 is exposed through the space between the connection member 900 and the cover member CRD, thereby preventing the connection pads DCPD from being exposed to the outside.

Although the configuration of the circuit board 20 is simplified in the drawing, but embodiments are not limited thereto. For example, the circuit board 20 may further include a photo solder resist (PSR) layer. The PSR layer may include a photosensitive organic polymer. For example, the photosensitive organic polymer may be commercially available in the circuit board package industry.

Figure 6:
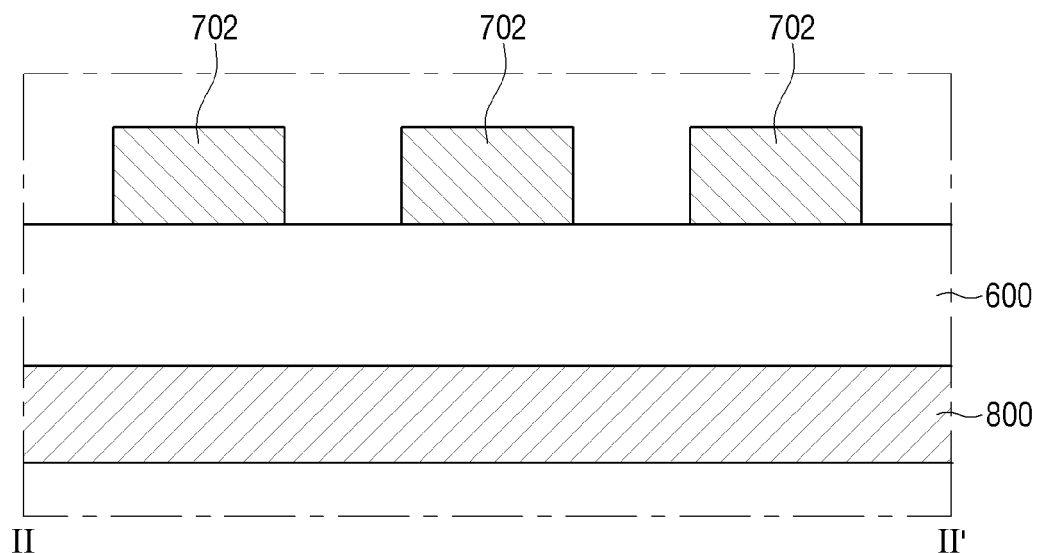
FIG. 6 is a schematic cross-sectional view taken along line II-II' of FIG. 3.

FIG. 6 is a schematic cross-sectional view taken along line II-II' of FIG. 3.

Referring to FIG. 6, the circuit board 20 may include the cover layer 800, the base layer 600, and the second pads 702. In a cross-sectional view, the surface of the circuit board 20 in the direction opposite to the third direction Z may be configured with the cover layer 800.

The rear surface of the base layer 600 may be disposed (e.g., directly disposed) on the front surface of the cover layer 800. The front surface of the cover layer 800 may be in contact with (e.g., in direct contact with) the rear surface of the base layer 600 and may cover the entire rear surface (or the partial rear surface) of the base layer 600. The second pads 702 may be disposed on the front surface of the base layer 600. In the cross-sectional view of FIG. 6, the first pad 701, the second pad 702, and the via holes VIA may not be disposed.

Figure 7:
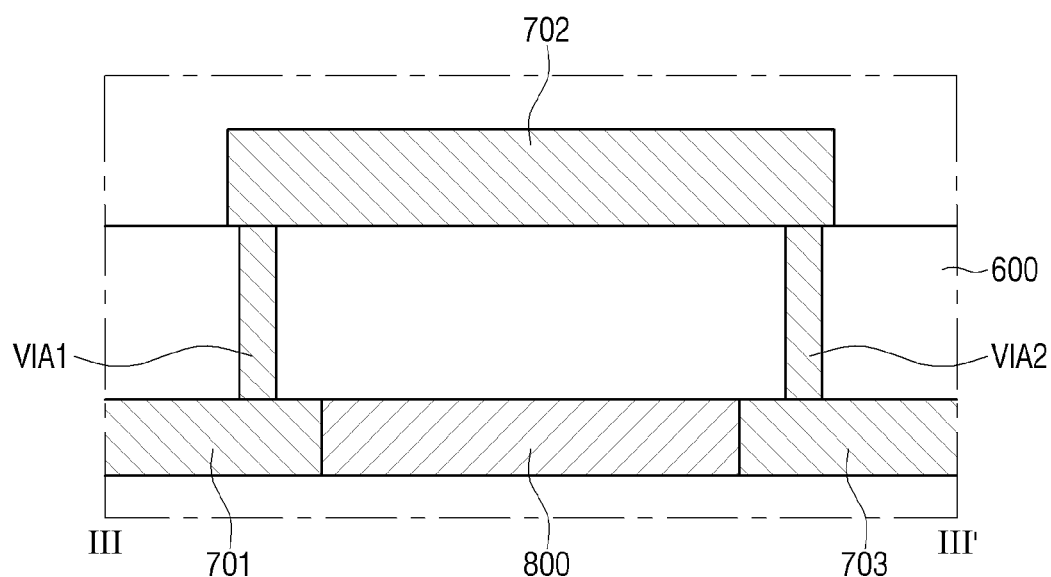
FIG. 7 is a schematic cross-sectional view of a circuit board, taken along line III-III' of FIG. 3.

FIG. 7 is a schematic cross-sectional view of a circuit board 20, taken along line III-III' of FIG. 3.

Referring to FIG. 7, the circuit board 20 may include the first pad 701, the cover layer 800, the third pad 703, the base layer 600, the via holes VIA, and the second pad 702.

In a cross-sectional view, the other side surface (e.g., the lower surface) of the circuit board 20 in the third direction Z may be configured with the first pad 701, the cover layer 800, and the third pad 703. For example, the first pad 701 and the third pad 703 may be spaced apart from each other in the second direction Y, and the cover layer 800 may be disposed between the first pad 701 and the third pad 703.

The base layer 600 and the via holes VIA penetrating the base layer 600 may be disposed on the front surfaces (or the upper surfaces) of the first pad 701, the cover layer 800, and the third pad 703. The first via hole VIA1 may overlap the first pad 701 in the third direction Z, and the second via hole VIA2 may overlap the third pad 703 in the third direction Z. The second pads 702 may be disposed on the front surface of the base layer 600. The second pad 702 may overlap the first via hole VIA1, the cover layer 800, and the second via hole VIA2 in the third direction Z, and the first pad 701 may overlap a portion of the third pad 703 in the third direction Z.

The first pad 701 and the second pad 702 may be connected (e.g., electrically connected) to each other only through the first via hole VIA1 and may not be connected (e.g., electrically connected) to each other through the other region of the base layer 600 in which the first via hole VIA1 is not disposed. The second pad 702 and the third pad 703 may be connected (e.g., electrically connected) to each other only through the second via hole VIA2 and may not be connected (e.g., electrically connected) to each other through the other region of the base layer 600 in which the second via hole VIA2 is not disposed.

Figure 8:
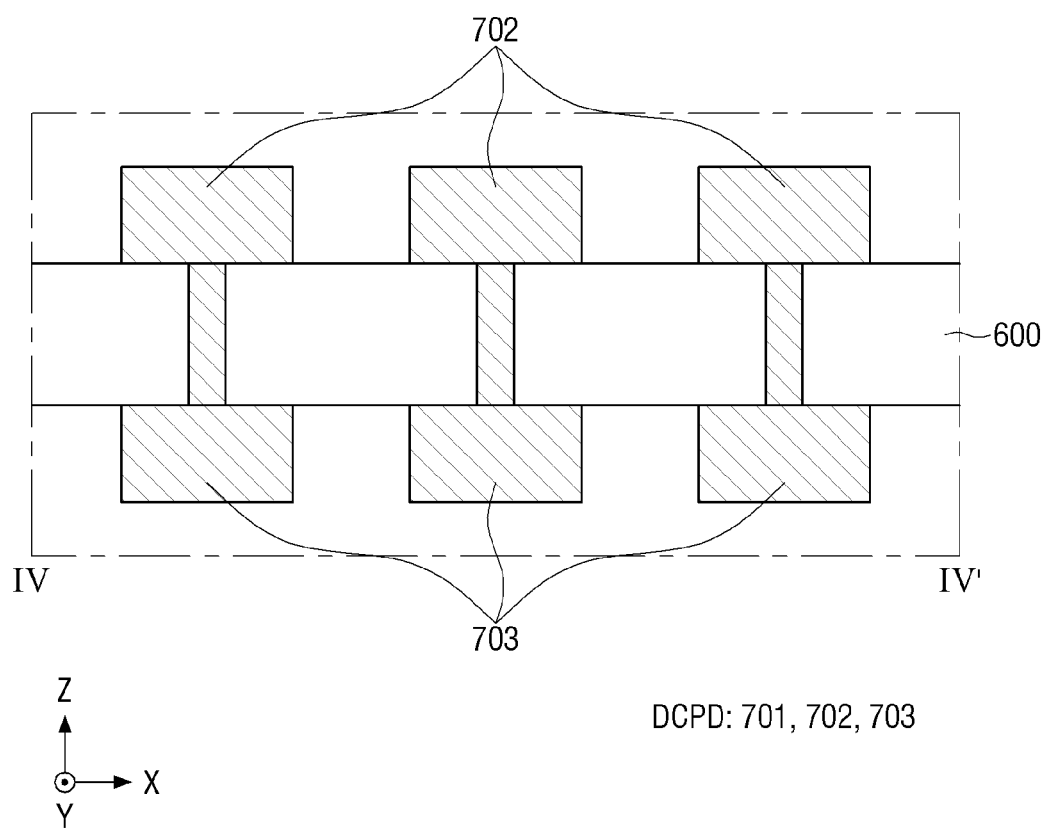
FIG. 8 is a schematic cross-sectional view of the circuit board, taken along line IV-IV' of FIG. 3.

FIG. 8 is a schematic cross-sectional view of the circuit board 20, taken along line IV-IV' of FIG. 3.

Referring to FIG. 8, the circuit board 20 may include the third pads 703, the base layer 600, the second via holes VIA2, and the second pads 702.

In a cross-sectional view, the other side surface of the circuit board 20 in the third direction Z may be configured with the third pads 703 and the base layer 600. For example, the other side surface of the circuit board 20 in the third direction Z may be configured with the base layer 600 and the third pads 703 having a shape protruding in the direction opposite to the third direction Z from the base layer 600.

The base layer 600 and the via holes VIA penetrating the base layer 600 in the third direction Z may be disposed on the front surfaces of the third pads 703. Since the connection pads DCPD shown in FIG. 8 are the third pads 703 and the second pads 702, the via holes VIA in FIG. 8 may all be the second via holes VIA2. The second pads 702 may be disposed on the front surface of the base layer 600. The second pad 702 may overlap the third pad 703 and the second via hole VIA2. Although the third pad 703 and the second pad 702 are illustrated as having the same size and being accurately aligned with each other in the third direction Z in the drawing, embodiments are not limited thereto. For example, the second pad 702 may be disposed to be staggered from each other to some extent. However, the second pad 702 may be disposed such that at least a portion thereof may overlap at least a portion of the third pad 703 in the third direction Z.

Figure 9:
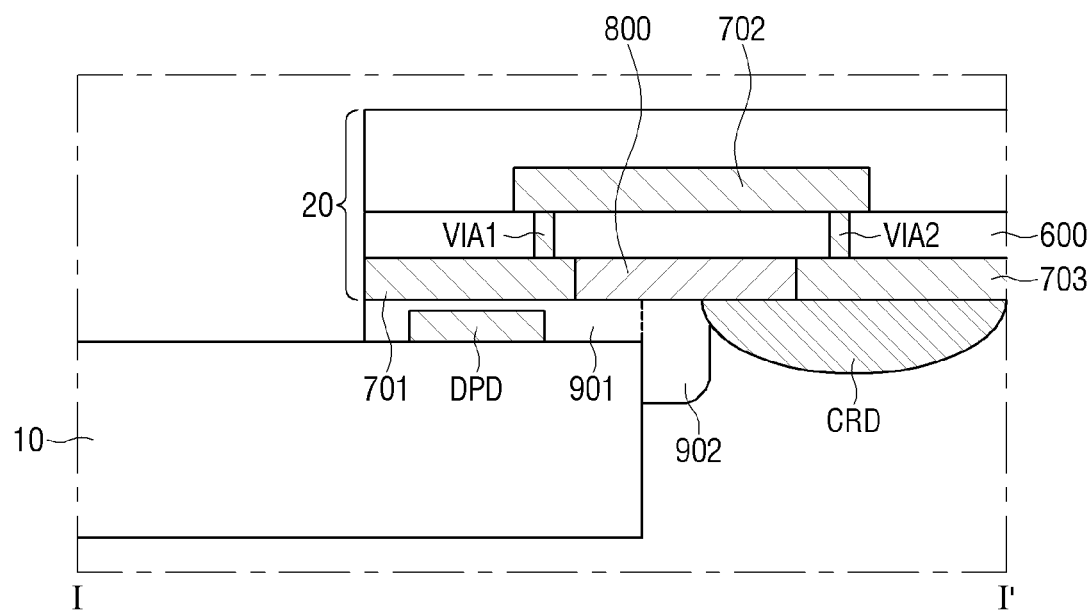
FIG. 9 is a schematic cross-sectional view of a display device according to an embodiment, taken along line I-I' of FIG. 1.
Figure 9:
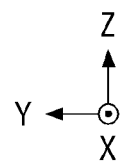

FIG. 9 is a schematic cross-sectional view of a display device according to an embodiment, taken along line I-I' of FIG. 1.

A display device according to the embodiment of FIG. 9 is different from the embodiment of FIG. 5 in that a connection member 900 protrudes in the direction opposite to the second direction Y from a front surface of a display panel 10. Hereinafter, a description redundant to the foregoing descriptions will be omitted and differences will be described for descriptive convenience.

Referring to FIG. 9, the connection member 900 may protrude in the direction opposite to the second direction Y from the front surface of the display panel 10 and may be in contact with (e.g., in direct contact with) a cover member CRD. A region of the connection member 900 which overlaps the display panel 10 in the third direction Z is defined as a planar part 901, and a region of the connection member 900 which protrudes in the direction opposite to the second direction Y from the front surface of the display panel 10 is defined as a protruding part 902.

The connection member 900 may cover a portion of the front surface of the display panel 10, as well as cover a portion of the other side surface (e.g., the right side surface) of the display panel 10 in the second direction Y. For example, the planar part 901 may cover a portion of the front surface of the display panel 10, and the protruding part 902 may cover a portion of the other side surface (e.g., the right side surface) of the display panel 10 in the second direction Y. For example, the connection member 900 may cover the entire rear surface (or the partial rear surface) of a cover layer 800 together with the cover member CRD. For example, according to an embodiment, the cover layer 800 may not be exposed to the outside.

A portion of the rear surface of the cover layer 800 may be covered by the cover member CRD and the other portion may be covered by the connection member 900, so that the rear surface of the cover layer 800 may not be exposed to the outside. For example, the infiltration of external moisture and foreign substances may be blocked firstly by the connection member 900 and the cover member CRD and secondarily by the cover layer 800. Thus, the infiltration of external moisture and/or foreign substances may be blocked more efficiently.

Figure 10:
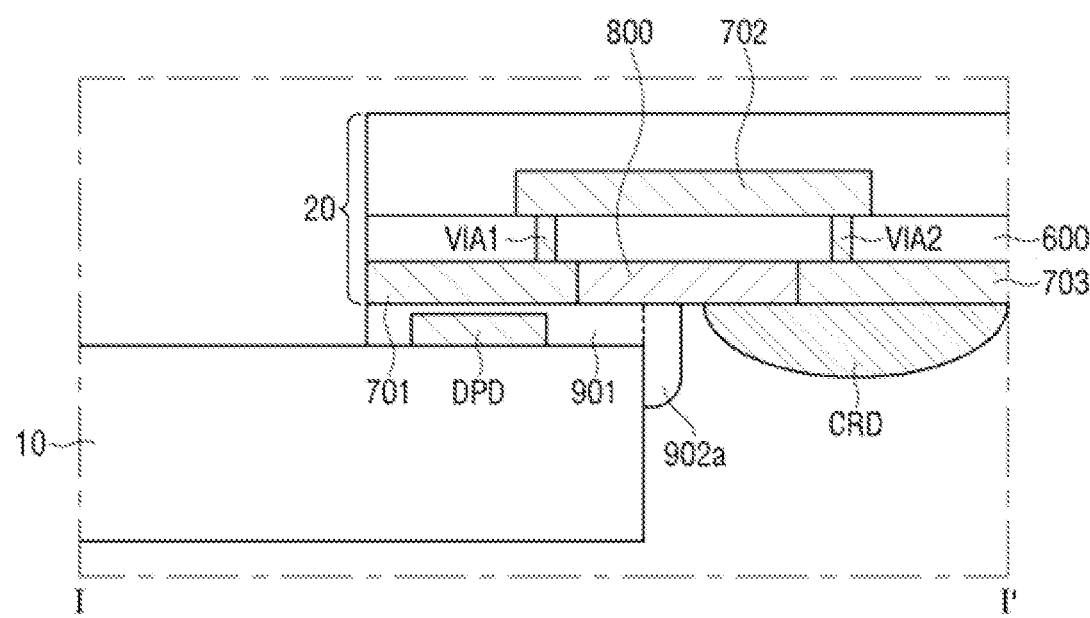
FIG. 10 is a schematic cross-sectional view of a display device according to an embodiment, taken along line I-I' of FIG. 1.

FIG. 10 is a schematic cross-sectional view of a display device according to an embodiment, taken along line I-I' of FIG. 1.

A display device according to the embodiment of FIG. 10 is different from the embodiment shown in FIG. 9 in that a connection member 900 and a cover member CRD are disposed to be spaced apart from each other.

Referring to FIG. 10, the connection member 900 may be disposed on the front surface of the display panel 10 and may protrude in the direction opposite to the second direction Y. However, the connection member 900 may be disposed to be spaced apart from the cover member CRD. For example, a protruding part 902a and the cover member CRD may be disposed to be spaced apart from each other. Accordingly, a portion of the cover layer 800 may be exposed to the outside through the space between the connection member 900 and the cover member CRD. For example, the rear surface of the cover layer 800 may include a region covered by a planar part 901, a region covered by the protruding part 902a, a region exposed to the outside, and a region covered by the cover member CRD.

Figure 11:
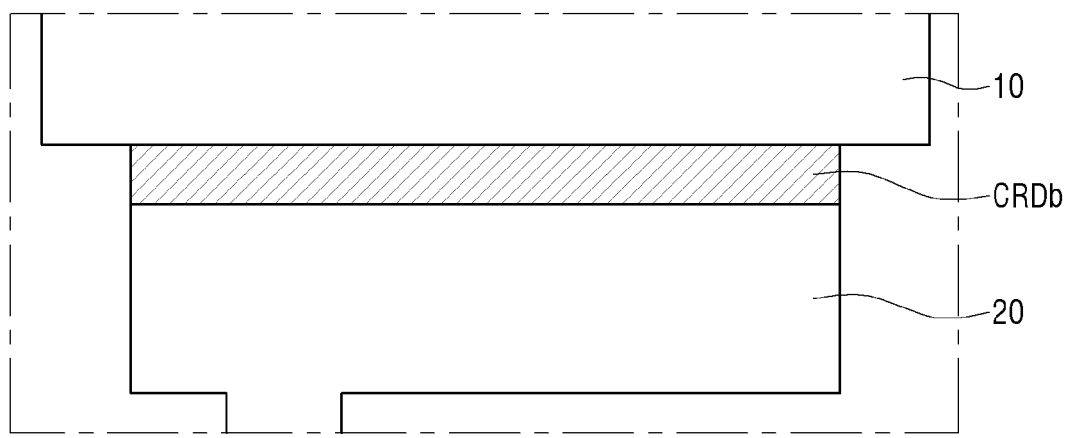
FIG. 11 is a schematic plan view shown a rear surface of a display device according to an embodiment.
Figure 12:
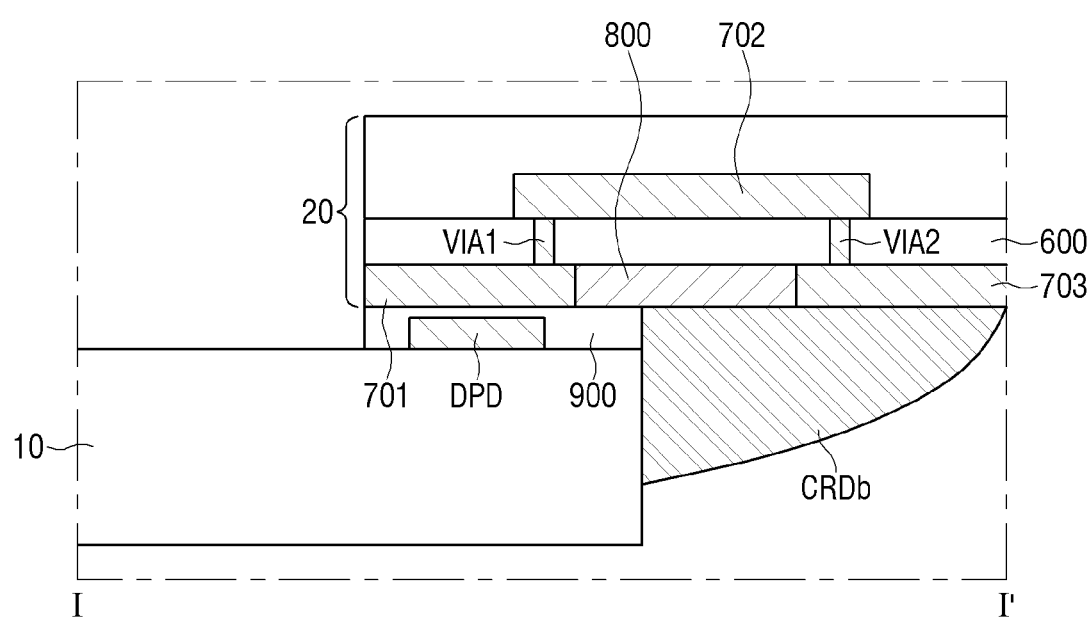
FIG. 12 is a schematic cross-sectional view of a display device according to an embodiment, taken along line I-I' of FIG. 1.

FIG. 11 is a schematic plan view shown a rear surface of a display device according to an embodiment. FIG. 12 is a schematic cross-sectional view of a display device according to an embodiment, taken along line I-I' of FIG. 1.

A display device according to the embodiment of FIG. 12 is different from the embodiment shown in FIGS. 4 and 5 in that a cover member CRDb is disposed to be in contact with (e.g., in direct contact with) a side surface of a display panel 10.

Referring to FIG. 11, a circuit board 20 may be disposed at a side of the display panel 10 in the direction opposite to the second direction Y in a plan view. The cover member CRDb may be disposed on the other surface (e.g., the rear surface or the lower surface) of the circuit board 20. The cover member CRDb on the other surface (e.g., the rear surface or the lower surface) of the circuit board 20 may be in contact with (e.g., in direct contact with) the other side surface of the display panel 10 in the second direction Y. Accordingly, there may be no separate space between the other side surface of the display panel 10 in the second direction Y and the cover member CRDb in a plan view.

Referring to FIG. 12, the cover member CRDb may cover not only a third pad 703 but also a cover layer 800 protruding from a connection member 900. Accordingly, the infiltration of external moisture and foreign substances may be blocked firstly by the cover member CRDb and secondarily by the cover layer 800. Thus, the infiltration of external moisture and/or foreign substances may be blocked more efficiently.

Figure 13:
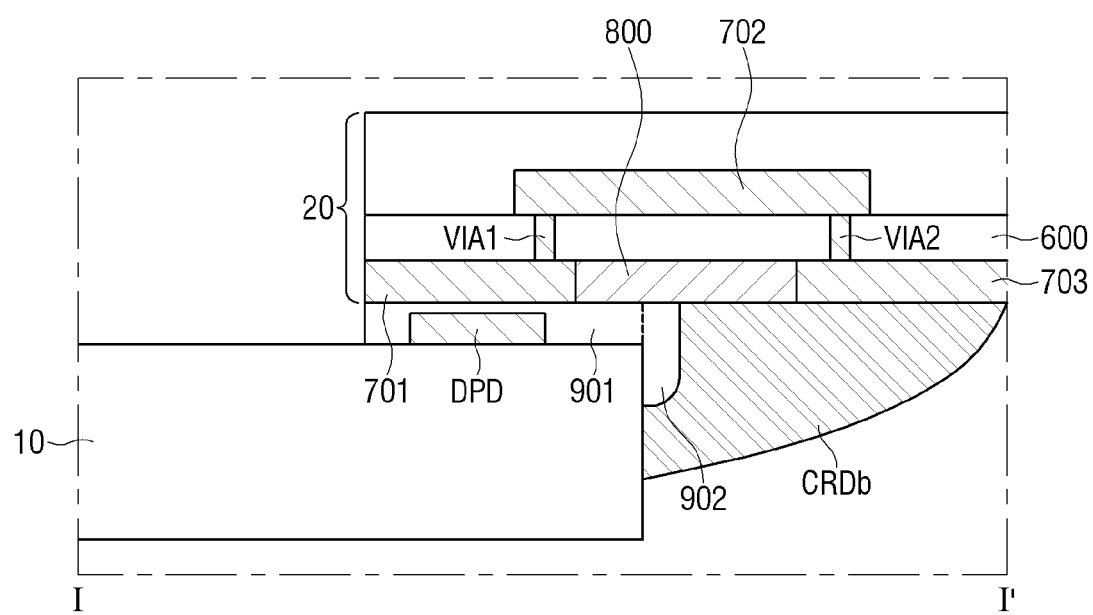
FIG. 13 is a schematic cross-sectional view of a display device according to an embodiment, taken along line I-I' of FIG. 1.

FIG. 13 is a schematic cross-sectional view of a display device according to an embodiment, taken along line I-I' of FIG. 1.

A display device according to the embodiment of FIG. 13 is different from the embodiment shown in FIGS. 11 and 12 in that a connection member 900 protrudes in the direction opposite to the second direction Y from a front surface of a display panel 10. A protruding part 902 may overlap a portion of a cover member CRDb in the third direction Z. A portion of the other side surface (e.g., the right side surface) of the display panel 10 in the second direction Y may be covered by the protruding part 902 and the other portion of the other side surface of the display panel 10 may be covered by the cover member CRDb.

Figure 14:
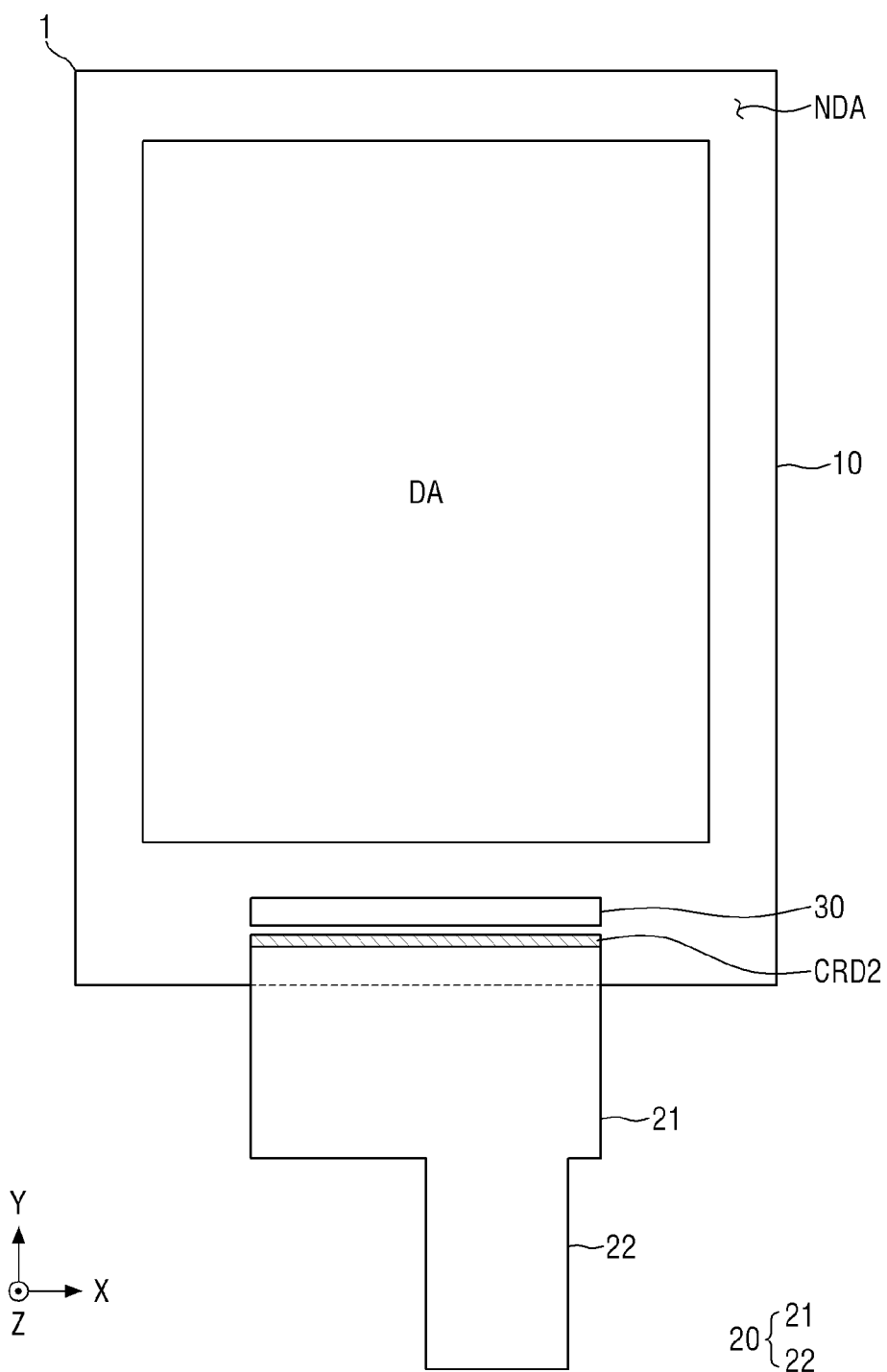
FIG. 14 is a schematic plan view of a display device according to an embodiment.
Figure 15:
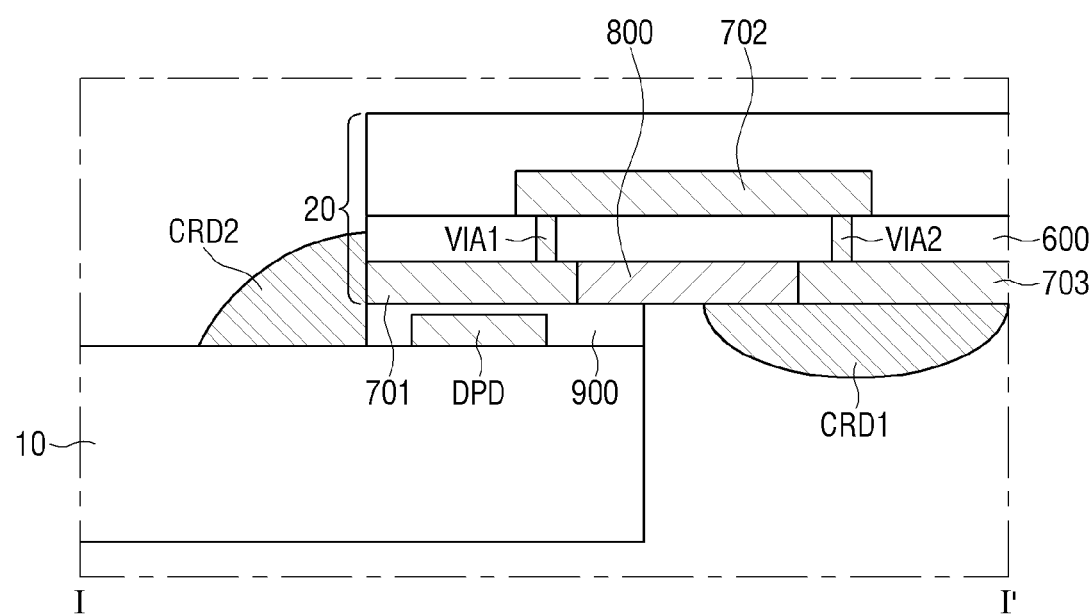
FIG. 15 is a schematic cross-sectional view of a display device according to an embodiment, taken along line I-I' of FIG. 1.

FIG. 14 is a schematic plan view of a display device according to an embodiment. FIG. 15 is a schematic cross-sectional view of a display device according to an embodiment, taken along line I-I' of FIG. 1.

A display device according to the embodiment of FIGS. 14 and 15 is different from the embodiment shown in FIGS. 1 and 5 in that a cover member CRD is disposed also on a front surface (e.g., the upper surface) of a display panel 10.

Referring to FIGS. 14 and 15, the cover member CRD may be disposed on the front surface of the display panel 10. A cover member CRD disposed on a rear surface (or the lower surface) of a circuit board 20 is defined as a first cover member CRD1 and a cover disposed on the front surface of the display panel 10 is defined as a second cover member CRD2.

The second cover member CRD2 may be disposed to be in contact with (e.g., in direct contact with) the front surface of the display panel 10 and a side surface (e.g., the left side surface) of the circuit board 20 in the second direction Y. Accordingly, the second cover member CRD2 may cover a portion of the front surface of the display panel 10 and a portion of a side surface (e.g., the left side surface) of the circuit board 20 to prevent external foreign substances from entering through the portion of front surface of the display panel 10 and the portion of the side surface of the circuit board 20 in the second direction Y.

The first cover member CRD1, the second cover member CRD2, and the cover member CRD may be made of substantially the same material.

Figure 16:
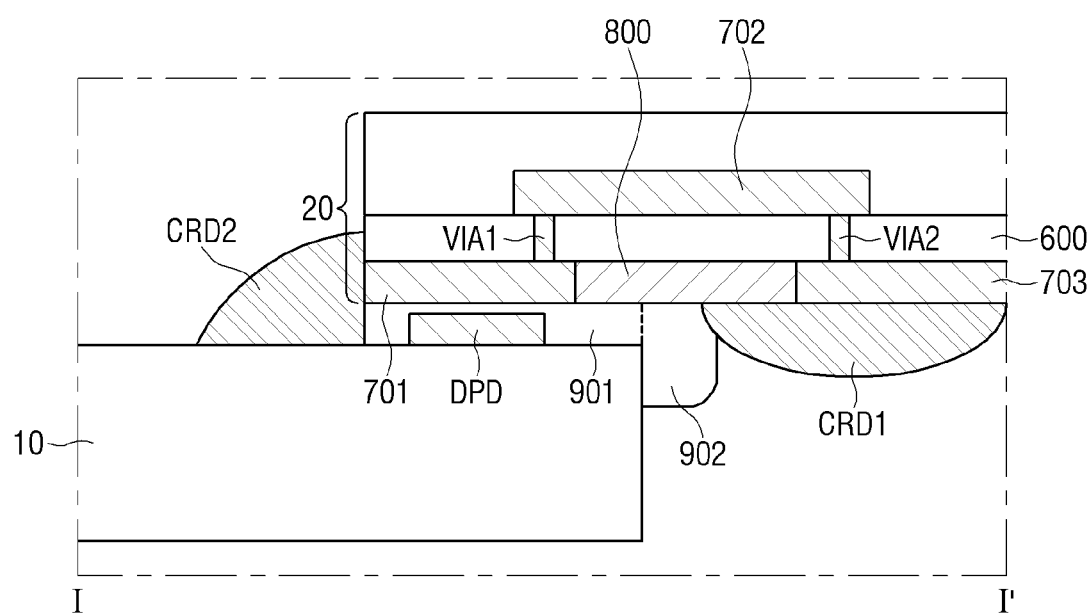
FIG. 16 is a schematic cross-sectional view of a display device according to an embodiment, taken along line I-I' of FIG. 1.

FIG. 16 is a schematic cross-sectional view of a display device according to an embodiment, taken along line I-I' of FIG. 1.

A display device according to the embodiment of FIG. 16 is different from the embodiment shown in FIGS. 14 and 15 in that a connection member 900 protrudes in the direction opposite to the second direction Y from a front surface of the display panel 10.

Referring to FIG. 16, the connection member 900 may protrude in the direction opposite to the second direction Y from the front surface of the display panel 10 and may be in contact with (e.g., in direct contact with) a cover member CRD. For example, a protruding part 902 may be in contact with (e.g., in direct contact with) a first cover member CRD1.

The connection member 900 may cover a portion of the front surface of the display panel 10, as well as cover a portion of the other side surface (e.g., the right side surface) of the display panel 10 of the display panel 10 in the second direction Y. For example, the planar part 901 may cover a portion of the front surface of the display panel 10, and the protruding part 902 may cover a portion of the other side surface (e.g., the right side surface) of the display panel 10 in the second direction Y. Also, the protruding part 902 may cover the entire rear surface of the cover layer 800, together with the first cover member CRD1. For example, according to an embodiment, the cover layer 800 may not be exposed to the outside.

A portion of the rear surface of the cover layer 800 may be covered by the first cover member CRD1 and the other portion thereof may be covered by the connection member 900, so that the rear surface of the cover layer 800 may not be exposed to the outside. For example, the infiltration of external moisture and foreign substances may be blocked firstly by the connection member 900 and the first cover member CRD1 and secondarily by the cover layer 800. Thus, the infiltration of external moisture and/or foreign substances may be blocked more efficiently.

Further, the connection member 900 and the first cover member CRD1 may be disposed to be in contact with (e.g., in direct contact with) each other, thereby covering the entire rear surface of the cover layer 800.

Features of various embodiments of the disclosure may be combined partially or totally. As will be clearly appreciated by those skilled in the art, technically various interactions and operations are possible. Various embodiments may be practiced individually or in combination.

In concluding the detailed description, those skilled in the art will appreciate that many variations and modifications may be made to the embodiments without substantially departing from the principles of the invention. Therefore, the disclosed embodiments of the invention are used in a generic and descriptive sense only and not for purposes of limitation.

What is claimed:

1. A display device comprising:
   a display panel comprising a display pad;
   a circuit board disposed at an end portion of the display panel, the circuit board comprising:
      a connection pad including:
         a first pad,
         a second pad, and
         a third pad,
      a cover layer, and
      a base layer; and
   a connection member disposed between the display panel and the circuit board, the connection member electrically connecting the display pad and the connection pad, wherein
   the first pad is disposed between the connection member and the base layer and is disposed on a first surface of the base layer,
   the second pad is disposed on a second surface of the base layer opposite to the first surface of the base layer,
   the third pad is spaced apart from the first pad and is disposed on the first surface of base layer,
   the cover layer is disposed between the first pad and the third pad and is disposed on the first surface of the base layer,
   the first pad and the second pad are electrically connected to each other, and
   the second pad and the third pad are electrically connected to each other.

2. The display device of claim 1, further comprising a cover member disposed on the circuit board, wherein
   the cover member and the connection member are disposed on a same surface of the circuit board.

3. The display device of claim 2, wherein the cover member covers a part of the third pad and the cover layer and is spaced apart from a side surface of the display panel adjacent to the cover member.

4. The display device of claim 3, wherein
   the connection member is disposed in a region in which the display panel and the circuit board overlap each other, and
   the cover layer is exposed through a space between the connection member and the cover member.

5. The display device of claim 3, wherein the connection member comprises:
   a planar part disposed in a region in which the display panel and the circuit board overlap each other, and
   a protruding part protruding toward the cover member from the planar part.

6. The display device of claim 5, wherein the protruding part covers a portion of a side surface of the display panel and is spaced apart from the cover member.

7. The display device of claim 6, wherein the cover layer is exposed through a space between the protruding part and the cover member.

8. The display device of claim 5, wherein the protruding part covers a portion of a side surface of the display panel and is in direct contact with the cover member.

9. The display device of claim 2, wherein the cover member covers a part of the third pad and the cover layer and a side surface of the display panel adjacent to the cover member.

10. The display device of claim 9, wherein the connection member is disposed in a region in which the display panel and the circuit board overlap each other.

11. The display device of claim 9, wherein the connection member comprises:
    a planar part disposed in a region in which the display panel and the circuit board overlap each other, and
    a protruding part protruding toward the cover member from the planar part.

12. The display device of claim 11, wherein the protruding part covers a portion of a side surface of the display panel and is in direct contact with the cover member.

13. The display device of claim 2, further comprising an auxiliary cover member disposed at the end portion of the display panel to cover a portion of a surface of the display panel and a portion of a side surface of the circuit board.

14. The display device of claim 13, wherein the cover member overlaps the cover layer in a thickness direction and the auxiliary cover member does not overlap the cover layer.

15. The display device of claim 1, wherein
    the first pad and the second pad are connected to each other through a first via hole penetrating the base layer, and
    the second pad and the third pad are connected to each other through a second via hole penetrating the base layer.

16. The display device of claim 15, wherein an internal space of each of the first via hole and the second via hole is filled with a conductive material.

17. The display device of claim 1, wherein
    the connection member is in direct contact with the first pad,
    the base layer is in direct contact with the cover layer, the first pad, the second pad, and the third pad, and
    the cover layer comprises an insulating material.

18. A circuit board comprising:
    a connection pad comprising:
       a first pad,
       a second pad, and
       a third pad;
    a cover layer disposed between the first pad and the third pad, the cover layer comprising an insulating material; and
    a base layer disposed between the first pad and the second pad and between the second pad and the third pad, wherein
    the first pad is disposed on a first surface of the base layer,
    the second pad is disposed on a second surface of the base layer opposite to the first surface of with the base layer,
    the third pad is spaced apart from the first pad and is disposed on the first surface of the base layer,
    the cover layer is disposed between the first pad and the third pad and is disposed on the first surface of the base layer,
    the first pad and the second pad are electrically connected to each other, and the second pad and the third pad are electrically connected to each other.

19. The circuit board of claim 18, wherein the first pad and the second pad are connected to each other through a first via hole penetrating the base layer and the second pad and the third pad are connected to each other through a second via hole penetrating the base layer.

20. The circuit board of claim 19, wherein
the base layer is in direct contact with the first pad, the second pad, and the third pad, and
an internal space of each of the first via hole and the second via hole is filled with a conductive material.

* * * * *